(12) United States Patent  (10) Patent No.: US 8,917,137 B2
Lee  (45) Date of Patent: Dec. 23, 2014

(54) POWER SUPPLY CIRCUIT

(71) Applicant: SK Hynix Inc., Icheon-si, Gyeonggi-do (KR)

(72) Inventor: Kyoung Youn Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 89 days.

(21) Appl. No.: 13/724,143

(22) Filed: Dec. 21, 2012

(65) Prior Publication Data

US 2014/0015601 A1    Jan. 16, 2014

(30) Foreign Application Priority Data

Jun. 28, 2012  (KR) ........................ 10-2012-0069820

(51) Int. Cl.
*G05F 1/10* (2006.01)
*G05F 3/02* (2006.01)
*H02M 3/158* (2006.01)
*G05F 1/00* (2006.01)

(52) U.S. Cl.
CPC ................. *H02M 3/158* (2013.01); *G05F 1/00* (2013.01)
USPC .......................................... 327/541; 327/540

(58) Field of Classification Search
USPC .......................................... 327/538, 540, 541
See application file for complete search history.

(56) References Cited

U.S. PATENT DOCUMENTS

| 6,781,443 | B2 * | 8/2004 | Hamamoto et al. | 327/541 |
| 7,843,256 | B2 | 11/2010 | Do | |
| 8,493,043 | B2 * | 7/2013 | Le et al. | 323/280 |
| 8,766,709 | B2 * | 7/2014 | Kim | 327/540 |

FOREIGN PATENT DOCUMENTS

KR           100650371 B1      11/2006

* cited by examiner

*Primary Examiner* — Hai L Nguyen
(74) *Attorney, Agent, or Firm* — William Park & Associates Patent Ltd.

(57) ABSTRACT

A power supply circuit to supply an internal voltage to an output node includes: a pull-up driver, in response to a result obtained by comparing the internal voltage to a first reference voltage, configured to generate the internal voltage from a power supply voltage, a pull-down driver, in response to a result obtained by comparing the internal voltage to a second reference voltage, configured to discharge the internal voltage, a pull-up drive blocking unit configured to block the pull-up driver from being driven, in response to the result obtained by comparing the internal voltage to the second reference voltage, and a pull-down drive blocking unit configured to block the pull-down driver from being driven, in response to the result obtained by comparing the internal voltage to the first reference voltage.

13 Claims, 5 Drawing Sheets

POWER SUPPLY CIRCUIT

CROSS-REFERENCES TO RELATED APPLICATION

The present application claims priority under 35 U.S.C. §119(a) to Korean application number 10-2012-0069820 filed on Jun. 28, 2012 in the Korean Intellectual Property Office, which is incorporated herein by reference in its entirety.

BACKGROUND

1. Technical Field

The present invention relates generally to a semiconductor integrated circuit, and more particularly, to a power supply circuit.

2. Related Art

Power supply voltages necessary to operate semiconductor memory apparatuses have decreased. In order to continue the trend, a variety of ways for obtaining stable memory operation characteristics have been proposed. For example, a power supply circuit using a voltage down converter is utilized in various manners.

In particular, a power supply circuit to generate a precharge voltage or cell plate voltage used in a semiconductor memory apparatus supplies a stable voltage using a pull-up driver and a pull-down driver, according to a scheme for generating a voltage having a lower level than an external power supply voltage.

FIG. 1 is a circuit diagram of a conventional power supply circuit.

Referring to FIG. 1, the power supply circuit to supply an internal voltage VINT to an output node ND includes a pull-up unit 10 and a pull-down unit 20.

The pull-up unit 10 includes a first comparator 11 and a pull-up driver 13.

The first comparator 11 is configured to compare the internal voltage VINT to a first reference voltage VREF1 and generate a pull-up signal PU1.

The pull-up driver 13 is configured to be driven by receiving the pull-up signal PU1 and generating the internal voltage VINT from a driving voltage VDD.

The pull-down unit 20 includes a second comparator 21 and a pull-down driver 23.

The second comparator 21 is configured to compare the internal voltage VINT to a second reference voltage VREF2 and generate a pull-down signal PD1.

The pull-down driver 23 is configured to be driven by receiving the pull-down signal PD1 and discharging the internal voltage VINT via VSS.

FIG. 2A is a waveform diagram illustrating an ideal operation of the power supply circuit of FIG. 1.

The first reference voltage VREF1 is set lower than the second reference voltage VREF2. The first reference voltage VREF1 is set lower by a predetermined level than the target level of the internal voltage VINT which is to be supplied, and the second reference voltage VREF2 is set higher by a predetermined level than the target level.

When the internal voltage level VINT is lower than the first reference voltage VREF1, the first comparator 11 activates the pull-up signal PU1. The pull-up driver 13 is driven to increase the level of the internal voltage VINT.

On the other hand, when the internal voltage level VINT is higher than the second reference voltage VREF2, the pull-up signal PU1 is deactivated, and the second comparator 21 activates the pull-down signal PD1. The pull-down driver 23 is driven to decrease the level of the internal voltage VINT.

When the internal voltage level VINT is between the first and second reference voltages VREF1 and VREF2, both of the pull-up driver 13 and the pull-down driver 23 are not driven. When the internal voltage level VINT is located in a predetermined level region based on the target level, the internal voltage level VINT is maintained. This region is referred to as a dead zone.

In reality, due to high integration of semiconductor memory apparatuses and varying process variations, the power supply circuit of FIG. 1 does not operate normally as illustrated in FIG. 2A, and rather, may operate to produce undesirable results.

FIG. 2B is a waveform diagram illustrating an undesirable result which may occur when the power supply circuit of FIG. 1 actually operates.

The first and second comparators 11 and 21 are implemented with a differential amplifier including transistors. Therefore, ideally, the first and second comparator 11 and 12 compare the first and second reference voltages VREF1 and VREF2 to the internal voltage VINT, respectively. In reality, however, the threshold voltages VT of transistors receiving the first and second reference voltages VREF1 and VREF2 and the internal voltage VINT may have an effect on the operation. For example, threshold voltage mismatch may occur between input transistors inside one comparator. The threshold voltage mismatch may change the comparison levels of the first and second comparators 11 and 21, which are compared to the internal voltage VINT. The first reference voltage VREF1 is set lower by a predetermined level than the second reference voltage VREF2, but the first comparison level to be substantially compared to the internal voltage VINT by the first comparator 11 may be higher is than the second comparison level to be substantially compared to the internal voltage VINT by the second comparator 21. FIG. 2B illustrates a problem occurring in such a case.

In FIG. 2B, A represents the first comparison level to be substantially compared to the internal voltage VINT by the first comparator 11, and B represents the second comparison level to be substantially compared to the internal voltage VINT by the second comparator 21.

When the internal voltage level VINT is lower than the first comparison level A, the pull-up driver 13 is driven, and when the internal voltage level VINT is higher than the second comparison level B, the pull-down driver 23 is driven. When the internal voltage level VINT is between the first and second comparison levels A and B, both of the pull-up driver 13 and the pull-down driver 23 are driven to form a current path from a driving voltage VDD to a ground voltage VSS. Therefore, unnecessary current consumption may occur.

SUMMARY

In one embodiment of the present invention, a power supply circuit to supply an internal voltage to an output node includes: a pull-up driver, in response to a result obtained by comparing the internal voltage to a first reference voltage, configured to generate the internal voltage from a power supply voltage; a pull-down driver, in response to a result obtained by comparing the internal voltage to a second reference voltage, configured to discharge the internal voltage; a pull-up drive blocking unit configured to block the pull-up driver from being driven, in response to the result obtained by comparing the internal voltage to the second reference voltage; and a pull-down drive blocking unit configured to block the pull-down driver from being driven, in response to the result obtained by comparing the internal voltage to the first reference voltage.

In another embodiment of the present invention, a power supply circuit supplies an internal voltage to an output node. The power supply circuit is driven to generate the internal voltage from a power supply voltage when the internal voltage level is lower than a first comparison level, and driven to discharge the internal voltage when the internal voltage level is higher than a second comparison level. When the first comparison level is higher than the second comparison level and the internal voltage level is between the first and second comparison levels, the power supply circuit is blocked from being driven.

In another embodiment of the present invention, a power supply circuit to supply an internal voltage to an output node includes: a first comparator configured to compare the internal voltage to a first comparison level and generate a pull-up signal; a second comparator configured to compare the internal voltage to a second comparison level and generate a pull-down signal; a pull-up driver configured to pull-up drive the internal voltage in response to the pull-up signal; a pull-down driver configured to pull-down drive the internal voltage in response to the pull-down signal; a pull-up drive blocking unit configured to block the pull-up driver from being driven, in response to the pull-down signal; and a pull-down drive blocking unit configured to block the pull-down driver from being driven, in response to the pull-up signal.

BRIEF DESCRIPTION OF THE DRAWINGS

Features, aspects, and embodiments are described in conjunction with the attached drawings, in which.

DETAILED DESCRIPTION

Hereinafter, a power supply circuit according to the present invention will be described below with reference to the accompanying drawings through various embodiments.

Figure 1:
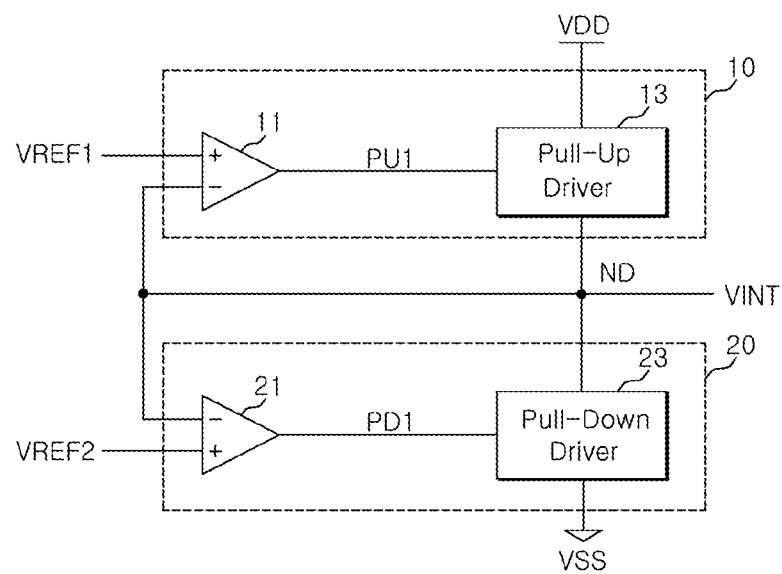
FIG. 1 is a circuit diagram of a conventional power supply circuit.
Figure 2A:
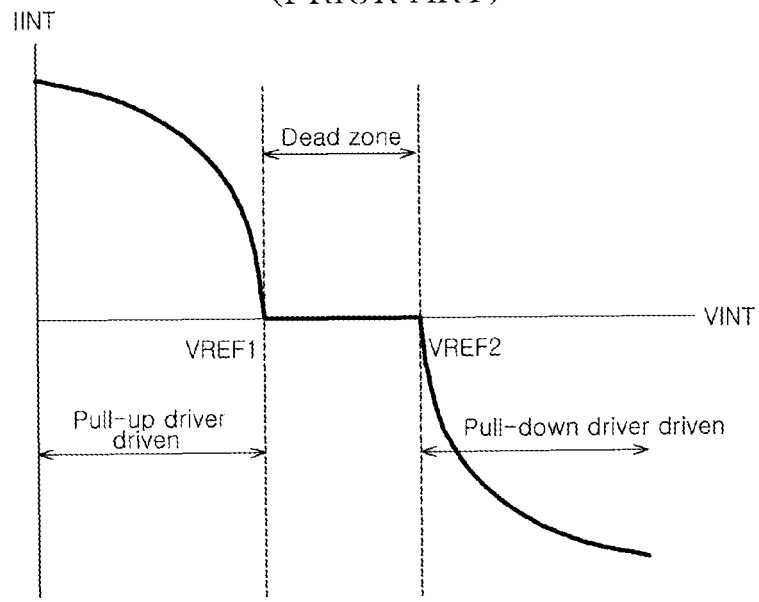
FIG. 2A is a waveform diagram illustrating an ideal operation of the power supply circuit of FIG. 1.
Figure 2B:
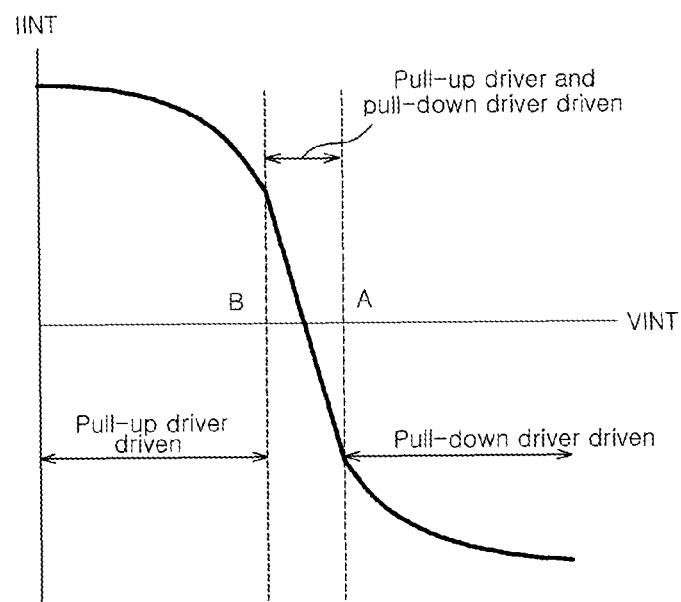
FIG. 2B is a waveform diagram illustrating an undesirable result which may occur when the power supply circuit of FIG. 1 actually operates.
Figure 3:
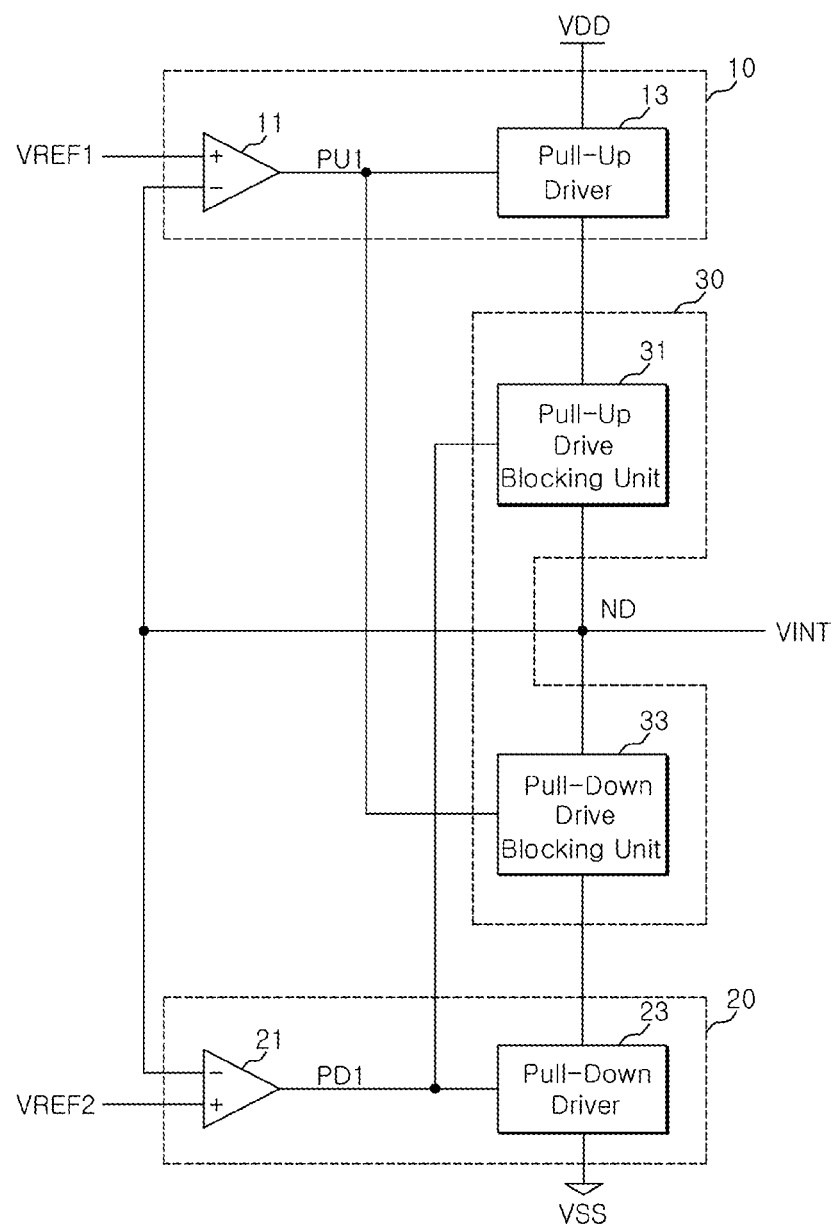
FIG. 3 is a circuit diagram of a power supply circuit according to one embodiment of the present invention.

FIG. 3 is a circuit diagram of a power supply circuit according to one embodiment of the present invention.

The power supply circuit of FIG. 3 may be used to generate a precharge voltage or cell plate voltage inside a semiconductor memory apparatus.

Referring to FIG. 3, the power supply circuit to supply an internal voltage VINT to an output node ND includes a pull-up unit 10, a pull-down unit 20, and a blocking unit 30.

The pull-up unit 10 includes a first comparator 11 and a pull-up driver 13.

The first comparator 11 is configured to compare the internal voltage VINT to a first reference voltage VREF1 and generate a pull-up signal PU1. Specifically, when the internal voltage level VINT is lower than the first reference voltage VREF1, the first comparator 11 generates the activated pull-up signal PU1.

The pull-up driver 13 is configured to be driven by receiving the pull-up signal PU1 and generating the internal voltage VINT from a driving voltage VDD. Specifically, when the activated pull-up signal PU1 is applied, the pull-up driver 13 pulls up the internal voltage level VINT.

The pull-down unit 20 includes a second comparator 21 and a pull-down driver 23.

The second comparator 21 is configured to compare the internal voltage VINT to the second reference voltage VREF2 and generate a pull-down signal PD1. Specifically, when the internal voltage level VINT is higher than the second reference voltage VREF2, the second comparator 21 generates the activated pull-down signal PD1.

The pull-down driver 23 is configured to be driven by receiving the pull-down signal PD1 and discharging the internal voltage VINT. Specifically, when the activated pull-down signal PD1 is applied, the pull-down driver 23 pulls down the internal voltage level VINT.

The blocking unit 30 includes a pull-up drive blocking unit 31 and a pull-down drive blocking unit 33.

The pull-up drive blocking unit 31 is connected between the pull-up driver 13 and the output node ND, and configured to block the drive of the pull-up driver 13 in response to the pull-down signal PD1.

The pull-down drive blocking unit 33 is connected between the pull-down driver 23 and the output node ND, and configured to block the pull-down driver 23 from being driven, in response to the pull-up signal PU1.

When the pull-up signal PU1 is activated, the power supply circuit drives the pull-up driver 13 and enables the pull-down drive blocking unit 33. On the other hand, when the pull-down signal PD1 is activated, the power supply circuit drives the pull-down driver 23 and enables the pull-up drive blocking unit 31. Therefore, when the pull-up signal PU1 and the pull-down signal PD1 are activated at the same time, both of the pull-up driver 13 and the pull-down driver 23 are not driven.

According to the embodiment of the present invention, when the first comparison level to be substantially compared to the internal voltage VINT by the first comparator 11 becomes higher than the second comparison level to be substantially compared to the internal voltage VINT by the second comparator 21 and the internal voltage level VINT is between the first and second comparison levels, it is possible to prevent a current path which may be formed between a power supply voltage VDD and a ground voltage VSS.

Figure 4:
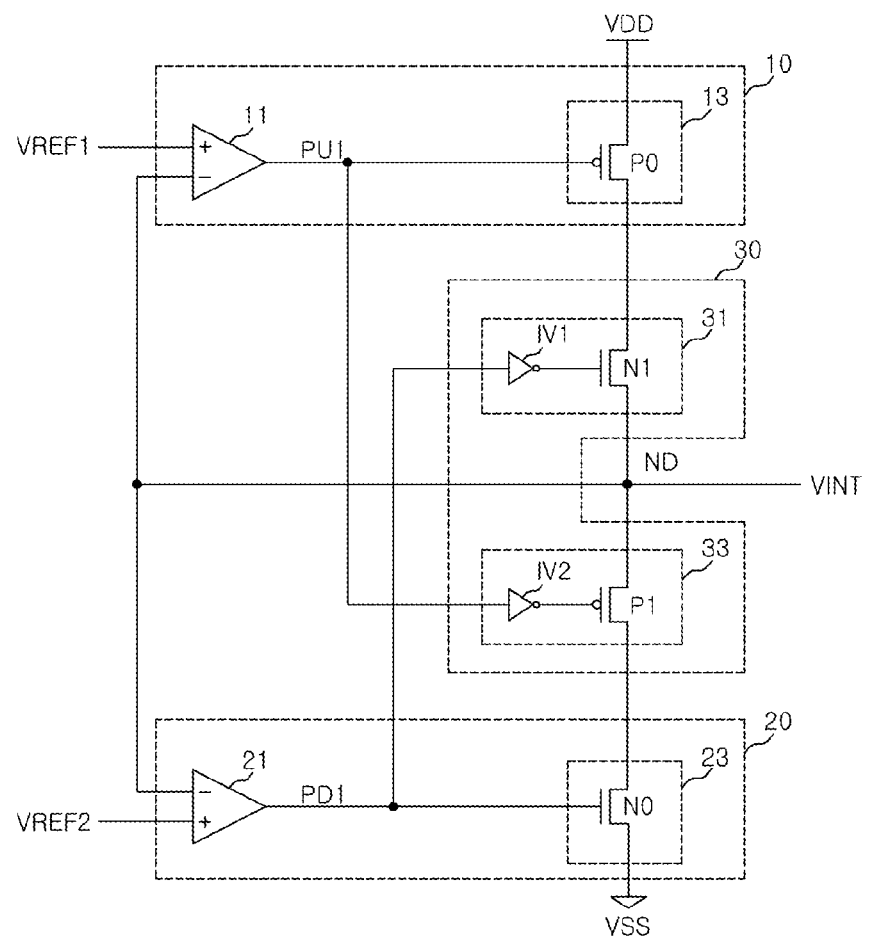
FIG. 4 is a circuit diagram illustrating a specific embodiment of the power supply circuit of FIG. 3.

FIG. 4 is a circuit diagram illustrating a specific embodiment of the power supply circuit of FIG. 3.

The first comparator 11, which may include an operational amplifier (OP-AMP), generates the pull-up signal PU1 activated to a low level, when the internal voltage level VINT is lower than the first comparison level to be substantially compared.

The second comparator 21, which may also include an OP-AMP, generates the pull-down signal PD1 activated to a high level, when the internal voltage level VINT is higher than the second comparison level to be substantially compared.

The pull-up driver 13 includes a first PMOS transistor P0, which is configured to receive the pull-up signal PU1 through a gate terminal and supply the power supply voltage VDD connected to a source terminal to a drain terminal.

The pull-up drive blocking unit 31 includes a first inverter IV1 and a second NMOS transistor N1.

The first inverter IV1 is configured to receive and invert the pull-down signal PD1. The first inverter IV1 serves to buffer the pull-down signal PD1.

The second NMOS transistor N1 is configured to receive an output of the first inverter IV1 through a gate terminal and connect the drain terminal of the first PMOS transistor PO to the output node ND.

The pull-down driver 23 includes a first NMOS transistor N0, which is configured to receive the pull-down signal PD1 through a gate terminal and connect a drain terminal to the ground voltage VSS connected to a source terminal.

The pull-down drive blocking unit 33 includes a second inverter IV2 and a second PMOS transistor P1.

The second inverter IV2 is configured to receive and invert the pull-up signal PU1. The second inverter IV2 serves to buffer the pull-up signal PU1.

The second PMOS transistor P1 is configured to receive an output of the second inverter IV2 through a gate terminal and connect the drain terminal of the first NMOS transistor N0 to the output node ND.

Figure 5:
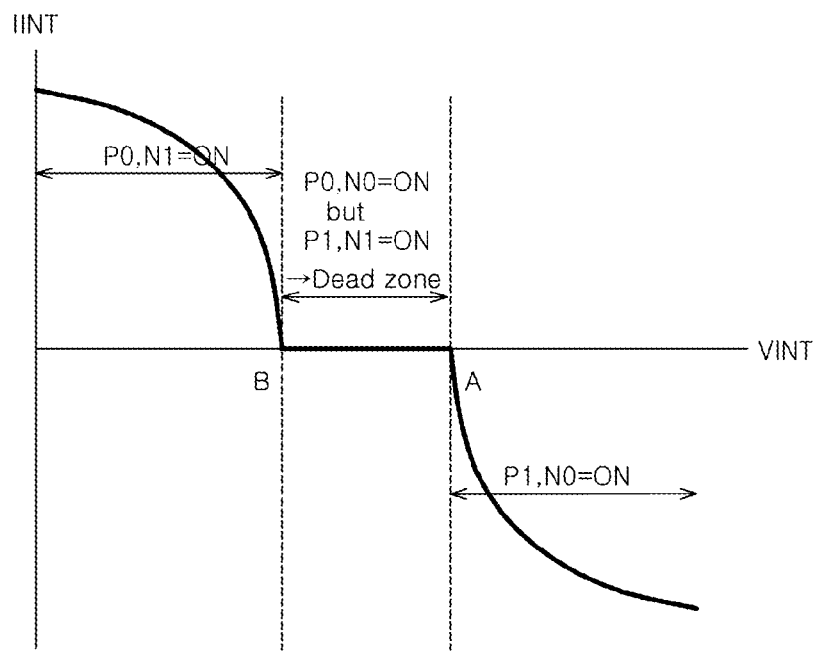
FIG. 5 is a waveform diagram illustrating the operation of the power supply circuit of FIGS. 3 and 4.

FIG. 5 is a waveform diagram illustrating the operation of the power supply circuit of FIGS. 3 and 4 according to the embodiment of the present invention.

The first reference voltage VREF1 is set lower by a predetermined level than the second reference voltage VREF2. As described above, however, the first comparison level to be substantially compared to the internal voltage VINT by the first comparator 11 may be higher than the second comparison level to be substantially compared to the internal voltage VINT by the second comparator 21. FIG. 5 illustrates an operation waveform in such a case.

In FIG. 5, A represents the first comparison level to be substantially compared to the internal voltage VINT by the first comparator 11, and B represents the second comparison level to be substantially compared to the internal voltage VINT by the second comparator 21.

Suppose that the internal voltage level VINT is lower than the second comparison level B. In this case, since the internal voltage level VINT is lower than the first comparison level A, the pull-up signal PU1 is activated, and the pull-down signal PD1 is deactivated. Therefore, the first PMOS transistor PO of the pull-up driver 13 and the second NMOS transistor N1 of the pull-up drive blocking unit 31 are turned on to pull up the internal voltage VINT.

On the other hand, suppose that the internal voltage level VINT is higher than the first comparison level A. In this case, since the internal voltage level VINT is higher than the second comparison level B, the pull-down signal PD1 is activated, and the pull-up signal PU1 is deactivated. Therefore, the first NMOS transistor N0 of the pull-down driver 23 and the second PMOS transistor P1 of the pull-down drive blocking unit 33 are turned on to pull-down the internal voltage VINT.

Suppose that the internal voltage level VINT is between the first and second comparison levels A and B. In this case, both of the pull-up signal PU1 and the pull-down signal PD1 are activated to turn on the first PMOS transistor PO of the pull-up driver 13 and the first NMOS transistor N0 of the pull-down driver 23. However, since both the second NMOS transistor N1 of the pull-up drive blocking unit 31 and the second PMOS transistor P1 of the pull-down drive blocking unit 33 are turned off, the pull-up driver 13 and the pull-down driver 23 are not driven. A dead zone is formed.

According to the embodiment of the present invention, it is possible to implement a dead zone between the target level of the internal voltage and the predetermined level.

While certain embodiments have been described above, it will be understood to those skilled in the art that the embodiments described are by way of example only. Accordingly, the power supply circuit described herein should not be limited based on the described embodiments. Rather, the power supply circuit described herein should only be limited in light of the claims that follow when taken in conjunction with the above description and accompanying drawings.

What is claimed is:

1. A power supply circuit to supply an internal voltage to an output node, comprising:
   a pull-up unit configured to include a pull-up driver and a first comparator, wherein the first comparator is configured to compare the internal voltage to a first reference voltage, and the pull-up driver is configured to be driven to pull up the internal voltage in response to a result obtained by comparing the internal voltage to the first reference voltage;
   a pull-down unit configured to include a pull-down driver and a second comparator, wherein the second comparator is configured to compare the internal voltage to a second reference voltage, and the pull-down driver is configured to pull-down the internal voltage in response to a result obtained by comparing the internal voltage to the second reference voltage;
   a pull-up drive blocking unit configured to block the pull-up driver from being driven, in response to the result obtained by comparing the internal voltage to the second reference voltage; and
   a pull-down drive blocking unit configured to block the pull-down driver from being driven, in response to the result obtained by comparing the internal voltage to the first reference voltage.

2. The power supply circuit according to claim 1, wherein the pull-up driver is driven when the internal voltage is lower than the first reference voltage.

3. The power supply circuit according to claim 1, wherein the pull-down driver is driven when the internal voltage is higher than the second reference voltage.

4. The power supply circuit according to claim 1, wherein the pull-up drive blocking unit blocks the pull-up driver from being driven, when the internal voltage is higher than the second reference voltage.

5. The power supply circuit according to claim 1, wherein the pull-down drive blocking unit blocks the pull-down driver from being driven, when the internal voltage is lower than the first reference voltage.

6. A power supply circuit to supply an internal voltage to an output node,
   wherein the power supply circuit is configured to include a pull-up unit, a pull-down unit, a pull-up drive blocking unit and a pull-down drive unit, the pull-up unit is configured to pull up the internal voltage when the internal voltage level is lower than a first reference voltage, and the pull-down unit is configured to pull-down the internal voltage when the internal voltage level is higher than a second reference voltage, and
   when the second reference voltage is higher than the first reference voltage and the internal voltage level is between the first and second comparison levels, the pull-up drive blocking unit and the pull-down drive blocking unit block the pull-up driver from being driven to pull up the internal voltage and block the pull-down driver from being driven to pull down the internal voltage.

7. A power supply circuit to supply an internal voltage to an output node, comprising:
   a first comparator configured to compare the internal voltage to a first reference voltage and generate a pull-up signal;

a second comparator configured to compare the internal voltage to a second reference voltage and generate a pull-down signal;

a pull-up driver configured to pull-up the internal voltage when the pull-up signal is activated;

a pull-down driver configured to pull-down the internal voltage when the pull-down signal is activated;

a pull-up drive blocking unit configured to block the pull-up driver from being driven, when the pull-down signal is activated; and a pull-down drive blocking unit configured to block the pull-down driver from being driven, when the pull-up signal is activated.

8. The power supply circuit according to claim 7, wherein the first comparator activates the pull-up signal when the internal voltage level is lower than the first comparison level.

9. The power supply circuit according to claim 7, wherein the second comparator activates the pull-down signal when the internal voltage level is higher than the second comparison level.

10. The power supply circuit according to claim 7, wherein the pull-up driver comprises a first PMOS transistor configured to receive the pull-up signal through a gate terminal, and supply a power supply voltage connected to a source terminal to a drain terminal.

11. The power supply circuit according to claim 10, wherein the pull-up drive blocking unit comprises:

a first inverter configured to receive and invert the pull-down signal; and a second NMOS transistor configured to receive an output of the first inverter through a gate terminal and electrically connect the drain terminal of the first PMOS transistor to the output node.

12. The power supply circuit according to claim 7, wherein the pull-down driver comprises a first NMOS transistor configured to receive the pull-down signal through a gate terminal, and electrically connect a drain terminal to a ground voltage connected to a source terminal.

13. The power supply circuit according to claim 12, wherein the pull-down drive blocking unit comprises:

a second inverter configured to receive and invert the pull-up signal; and a second PMOS transistor configured to receive an output of the second inverter through a gate terminal and electrically connect the drain terminal of the first NMOS transistor to the output node.

* * * * *